United States Patent
Anand et al.

(10) Patent No.: US 10,292,257 B2
(45) Date of Patent: May 14, 2019

(54) CROSS-TALK REDUCTION FOR HIGH SPEED SIGNALING AT BALL GRID ARRAY REGION AND CONNECTOR REGION

(71) Applicant: Juniper Networks, Inc., Sunnyvale, CA (US)

(72) Inventors: Raja C T Anand, Bangalore (IN); Satish Kumar Brugumalla, Bangalore (IN)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/903,327

(22) Filed: Feb. 23, 2018

(65) Prior Publication Data

US 2018/0184515 A1 Jun. 28, 2018

Related U.S. Application Data

(63) Continuation of application No. 14/640,801, filed on Mar. 6, 2015, now Pat. No. 9,907,156.

(51) Int. Cl.
| | |
|---|---|
| *H05K 1/02* | (2006.01) |
| *H05K 1/11* | (2006.01) |
| *H05K 1/18* | (2006.01) |
| *H05K 3/42* | (2006.01) |
| *H05K 3/30* | (2006.01) |

(52) U.S. Cl.
CPC ......... *H05K 1/0216* (2013.01); *H05K 1/0298* (2013.01); *H05K 1/113* (2013.01); *H05K 1/181* (2013.01); *H05K 3/301* (2013.01); *H05K 3/429* (2013.01); *H05K 2201/10734* (2013.01)

(58) Field of Classification Search
CPC ...... H05K 1/0216; H05K 1/181; H05K 1/113; H05K 1/0298; H05K 3/301; H05K 3/429
See application file for complete search history.

(56) References Cited

U.S. PATENT DOCUMENTS

| | | | |
|---|---|---|---|
| 5,898,217 A * | 4/1999 | Johnston | ........... H01L 23/49822 257/690 |
| 6,008,534 A | 12/1999 | Fulcher | |
| 6,392,160 B1 | 5/2002 | Andry | |
| 6,479,758 B1 | 11/2002 | Arima | |
| 6,675,473 B2 | 1/2004 | Ross | |
| 6,908,340 B1 | 6/2005 | Shafer | |

(Continued)

FOREIGN PATENT DOCUMENTS

WO    WO 2014/039924    3/2014

*Primary Examiner* — Nathan Milakovich
(74) *Attorney, Agent, or Firm* — Harrity & Harrity, LLP

(57) ABSTRACT

A multilayered printed circuit board (PCB) may include a plurality of pads associated with facilitating a connection to a component. The component may include a first edge and a second edge. The plurality of pads may include a first pad, located between a second pad and the first edge. The PCB may include a plurality of vertically disposed vias electrically connected to the plurality of pads and a plurality of horizontally disposed signal layers, electrically connected by the plurality of vias, to route a set of signals toward the first edge. The set of signals may include a first signal that is routed by a first via, of the plurality of vias, and a first signal layer of the plurality of signal layers and a second signal that is routed by a second via, of the plurality of vias, and a second signal layer of the plurality of signal layers.

20 Claims, 7 Drawing Sheets

(56) References Cited

U.S. PATENT DOCUMENTS

| | | | |
|---|---|---|---|
| 7,217,889 B1 | 5/2007 | Parameswaran et al. | |
| 7,366,086 B2 | 4/2008 | Abel et al. | |
| 7,402,757 B1 | 7/2008 | Noujeim | |
| 8,051,338 B2 | 11/2011 | Bethard | |
| 8,302,301 B2 | 11/2012 | Lau | |
| 8,324,019 B2 | 12/2012 | Tang et al. | |
| 8,325,459 B2 | 12/2012 | Mutnury | |
| 8,507,807 B2 | 8/2013 | Takeda | |
| 8,715,006 B2 | 5/2014 | Jeon | |
| 8,889,999 B2 | 11/2014 | Thurairajaratnam | |
| 9,202,783 B1 | 12/2015 | Simpson | |
| 9,220,164 B2 | 12/2015 | Kitajima | |
| 9,763,327 B2 * | 9/2017 | Pen | H05K 1/115 |
| 9,907,156 B1 | 2/2018 | Anand et al. | |
| 2004/0150970 A1 | 8/2004 | Lee | |
| 2008/0238585 A1 | 10/2008 | Tokoro | |
| 2009/0045889 A1 | 2/2009 | Goergen | |
| 2009/0188710 A1 | 7/2009 | Senk | |
| 2010/0307798 A1 | 12/2010 | Izadian | |
| 2012/0048608 A1 | 3/2012 | Chu | |
| 2012/0068339 A1 | 3/2012 | Miller | |
| 2012/0302075 A1 | 11/2012 | Muraoka | |
| 2015/0014044 A1 * | 1/2015 | Ao | H05K 3/0005 174/266 |
| 2015/0348901 A1 | 12/2015 | Warwick | |
| 2018/0184524 A1 * | 6/2018 | Xiong | H01L 23/49816 |

* cited by examiner

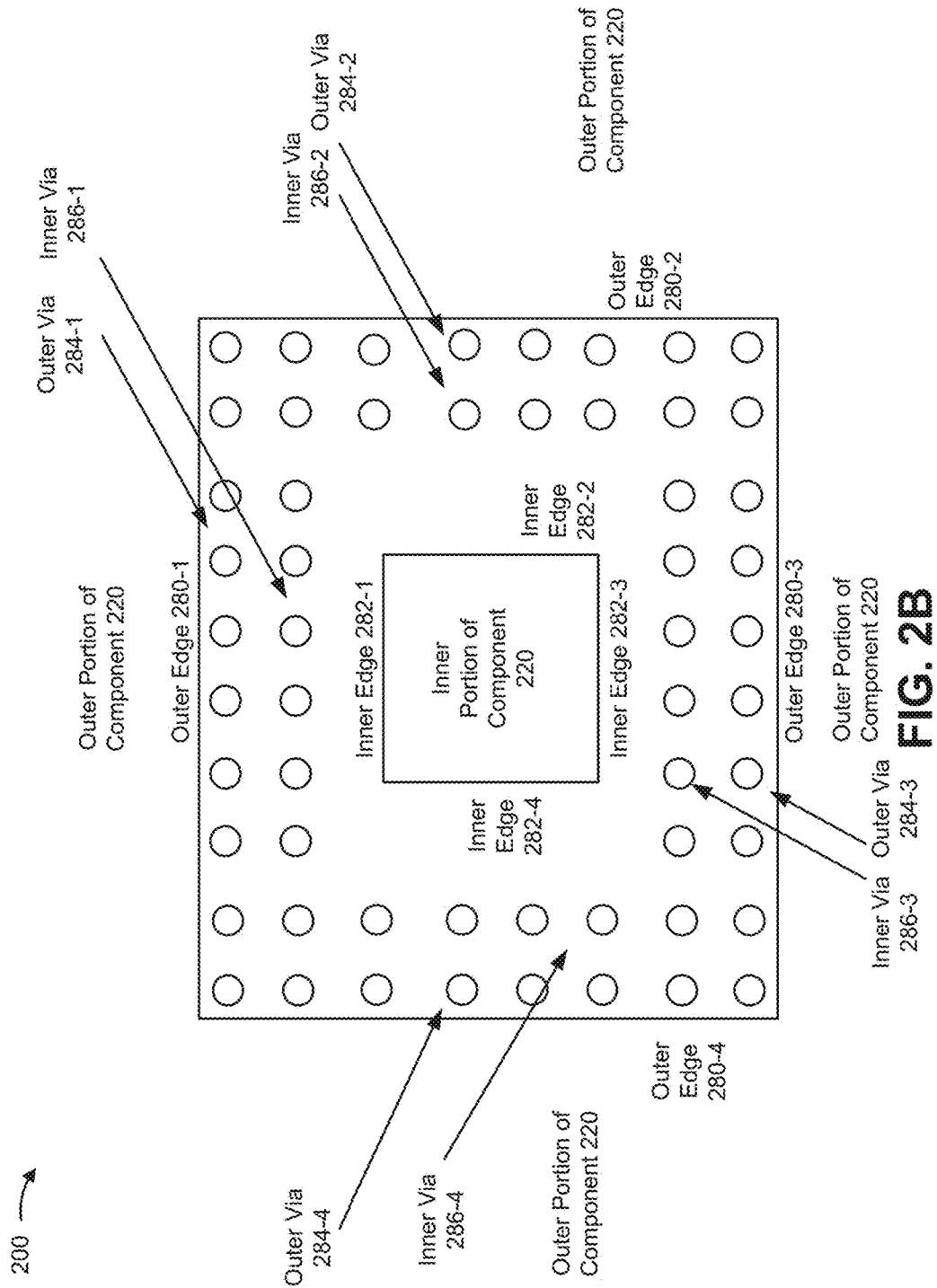

CROSS-TALK REDUCTION FOR HIGH SPEED SIGNALING AT BALL GRID ARRAY REGION AND CONNECTOR REGION

RELATED APPLICATION

This application is a continuation of U.S. patent application Ser. No. 14/640,801, filed Mar. 6, 2015 (now U.S. Pat. No. 9,907,156), which is incorporated herein by reference.

BACKGROUND

A printed circuit board (PCB) may be utilized to facilitate transmitter and receiver signal routing for high speed data connections. High speed signals being transmitted via a PCB, such as signals carrying information at rates of 25 Gigabits per second (Gbps) or greater, may experience significant signal integrity disturbances as a result of reflection, cross-talk, and ground bounce. The signal integrity disturbances may result in reduced network performance. Cross-talk, such as line-to-via cross-talk, may be reduced in a PCB open field region by increasing signal line spacing, adding a ground guard between signal lines, minimizing signal line parallelism, and maintaining traces within a particular proximity of a reference metal plane.

SUMMARY

According to some possible implementations, a multi-layer printed circuit board (PCB) may include a plurality of pads associated with facilitating a connection to a component. The component may include a first edge and a second edge. The plurality of pads may include a first pad and a second pad. The first pad may be located between the second pad and the first edge. The PCB may include a plurality of vertically disposed vias electrically connected to the plurality of pads. The PCB may include a plurality of horizontally disposed signal layers, electrically connected by the plurality of vias, to route a set of signals toward the first edge. The set of signals may include a first signal that is routed by a first via, of the plurality of vias, and a first signal layer of the plurality of signal layers. The first via may be associated with the first pad. The first via may be backdrilled to between the first signal layer and the second signal layer. The set of signals may include a second signal that is routed by a second via, of the plurality of vias, and a second signal layer of the plurality of signal layers. The second via may be associated with the second pad. The first signal layer may be located closer to a top surface of the PCB than the second signal layer.

According to some possible implementations, a device may include a plurality of pads to connect an integrated circuit to the device via a ball grid array. The plurality of pads may be located on a top surface of the device. The device may include a plurality of vertically disposed vias connected to one or more pads of the plurality of pads. The device may include a plurality of signal layers, electrically connected by the plurality of vias, to route signals to/from the integrated circuit. The signals may include a first signal that is routed by a first via of the plurality of vias, a first pad of the one or more pads, and a first signal layer of the plurality of signal layers. The signals may include a second signal that is routed by a second via of the plurality of vias, a second pad of the one or more pads, and a second signal layer of the plurality of signal layers. The first signal layer may be positioned within the device based on a direction of signal routing at the first signal layer. The first via may be selectively backdrilled to a location within the device between the first signal layer and the second signal layer based on the direction of signal routing at the first signal layer and a position of the first pad in the ball grid array. The second signal layer may be positioned within the device based on a direction of signal routing at the second signal layer. The second via may be selectively backdrilled to a location within the device between the first signal layer and the second signal layer based on the direction of signal routing at the second signal layer and a position of the second pad in the ball grid array.

According to some possible implementations, a method may include fabricating a printed circuit board (PCB) to include a plurality of vertically disposed vias. The PCB may further include a plurality of horizontally disposed signal layers, electrically connected by the plurality of vias, to route signals to or from the vias. The plurality of signal layers may include a first signal layer electrically connected to a first via, of the plurality of vias, and associated with routing a first signal. The plurality of signal layers may include a second signal layer electrically connected to a second via, of the plurality of vias, and associated with routing a second signal. The method may include backdrilling the PCB, from a bottom surface of the PCB, to remove conductive portions of the first via to a location, within the PCB, between the first signal layer and the second signal layer. The first signal layer may be located closer to a top surface of the PCB than the second signal layer. The first via may be selected for backdrilling based on the first signal and the second signal being respectively routed by the first signal layer and the second signal layer in a direction from the second via toward the first via.

BRIEF DESCRIPTION OF THE DRAWINGS

FIGS. 2A-2C are diagrams of an example printed circuit board with reduced cross-talk at the ball grid array region and the connector region;

DETAILED DESCRIPTION

The following detailed description of example implementations refers to the accompanying drawings. The same reference numbers in different drawings may identify the same or similar elements.

A printed circuit board (PCB) may include one or more material layers that mechanically support and electrically connect electronic components using conductive pathways. The conductive pathways may be etched from copper sheets laminated onto a non-conductive substrate. The pathways may be organized as a number of layers on the PCB in order to increase the signal transmission density of the PCB. A PCB, after populating with electronic components, is commonly referred to as a printed circuit assembly (PCA).

PCBs may be used in high frequency applications. For example, a PCB may be populated with an integrated circuit used to enable high speed serial links to and from the PCB, as may be utilized for an Ethernet switch, a serializer/deserializer (SerDes), or the like. In a high frequency application, the PCB can experience significant signal integrity disturbances as a result of the unused portions of through-holes and vias, called stubs that extend past the last connected layer of the PCB. The stubs can present resonances, impedance discontinuities, and increase the loss of the channel, thereby limiting performance.

For low density and low data rate serial links (e.g., <5 Gb/s), the signal lines are commonly routed on thin PCB substrates with Ball Grid Array (BGA) regions connected to short vias, and can tolerate small stubs and present few challenges with power delivery. However, an increase in the stub length and/or an increase in the quantity of signal lines being accommodated by the PCB may correspond to an increase in signal integrity disturbances.

Cross-talk may be reduced in the PCB open field region via a number of techniques, such as increasing signal line spacing, utilizing a ground guard between signal lines, reducing signal line parallelism, maintaining traces in a particular proximity to a reference metal plane, or the like. However, these techniques may be insufficient to reduce cross-talk (e.g., line-to-via cross-talk) in the PCB BGA region and connector region. Implementations, described herein, may utilize a particular set of selected layers, selected based on backdrilling of the PCB, to improve signal integrity at the BGA region and the connector region.

Figure 1:
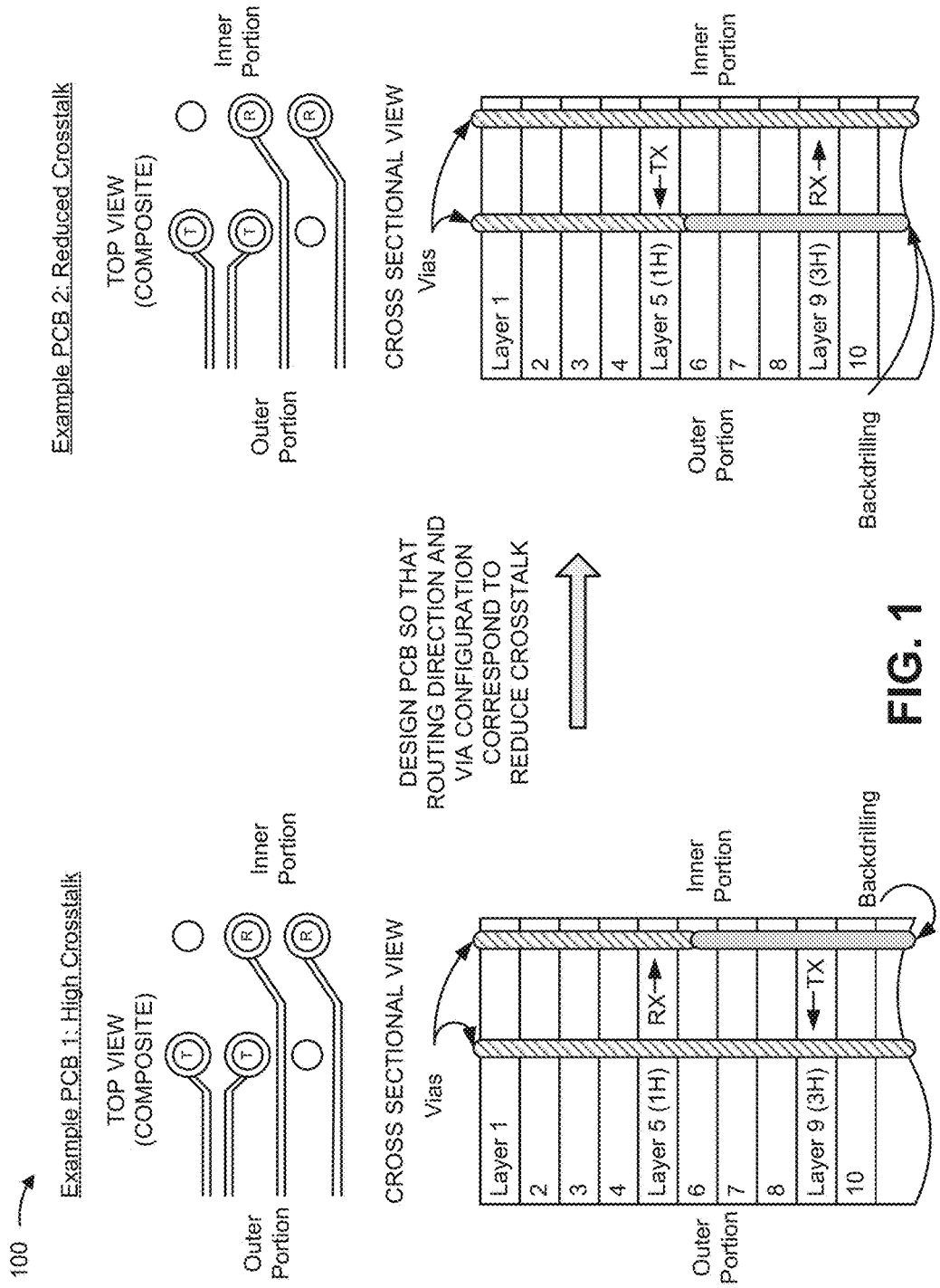
FIG. 1 is a diagram of an overview of an example implementation described herein.

FIG. 1 is a diagram of an overview of an example implementation 100 described herein. An example PCB 1 may be designed with a particular set of layers. PCB 1 may be associated with a serializer/deserializer (SerDes) application-specific integrated circuit (ASIC), such as a 25G SerDes ASIC, a 10G SerDes ASIC, or the like. PCB 1 may include a BGA region including a set of vias, shown in a "TOP VIEW." A component may connect to PCB 1 using the set of vias. PCB 1 may include a set of layers through which the set of vias may provide a set of electrical connections, as shown in the "CROSS SECTIONAL VIEW." PCB 1 may be associated with performing routing of a transmitter (TX) signal and a receiver (RX) signal. The TX signal may be a cross-talk aggressor and the RX signal may be a cross-talk victim. In other words, the TX signal may cause line-to-via cross-talk in the RX signal path. The particular set of layers may be configured to include, in the BGA region, a set of inner vias (e.g., a first set of vias closer to the inner portion of the component than a second set of vias, termed outer vias) extending to the 1H layer (e.g., layer 5) that is backdrilled to a layer above the 3H layer (e.g., layer 9) and below the 1H layer (e.g., to layer 6) to remove conductive material from the via stub. The particular set of layers includes a set of outer vias extending to the 3H layer (e.g., layer 9).

In PCB 1, the set of inner vias are selected as the RX vias and RX routing may be performed at the layer. In PCB 1, the set of outer vias are selected as the TX vias and TX routing may be performed at the 3H layer. Thus, the "TOP VIEW" of PCB 1 shows a composite of the 1H layer and the 3H layer at which RX routing and TX routing are performed, respectively. In PCB 1, signal routing at the 1H layer and the 3H layer may be in the direction from the inner portion of the component to the outer portion of the component using electrical paths connected to the vias. In this configuration, the presence of conductive material associated with the outer vias at the layer of RX routing results in cross-talk being relatively high compared with PCB 2 as a result of line-to-via coupling.

By contrast, in PCB 2, the set of outer vias are backdrilled to a layer above the 3H layer and below the 1H layer to remove conductive material from the via stub. In PCB 2, the set of outer vias are selected as the TX vias and TX routing may be performed at the 1H layer. In PCB 2, the set of inner vias are selected as the RX vias and RX routing be performed at the 3H layer. Thus, the "TOP VIEW" of PCB 2 is a composite view showing TX routing at the layer and RX routing at the 3H layer. In this configuration, conductive material of the set of outer vias does not extend to the 3H layer at which RX routing is performed. As a result, cross-talk is reduced as compared with PCB 1.

In some implementations, selecting the configuration illustrated by PCB 2 may result in a reduction in near-end cross-talk (NEXT). For example, when adjacent vias are interleaved (e.g., RX/TX pairs), NEXT is reduced by utilizing the configuration illustrated by PCB 2. Additionally, and alternatively, when adjacent vias are of the same type (e.g., RX/RX pairs and/or TX/TX pairs), far-end cross-talk (FEXT) is reduced by utilizing the configuration illustrated by PCB 2.

In this way, signal integrity may be improved by reducing cross-talk in the BGA and connector regions of a PCB with selection of routing layers and vias based on backdrilling of the vias.

Figure 2A:
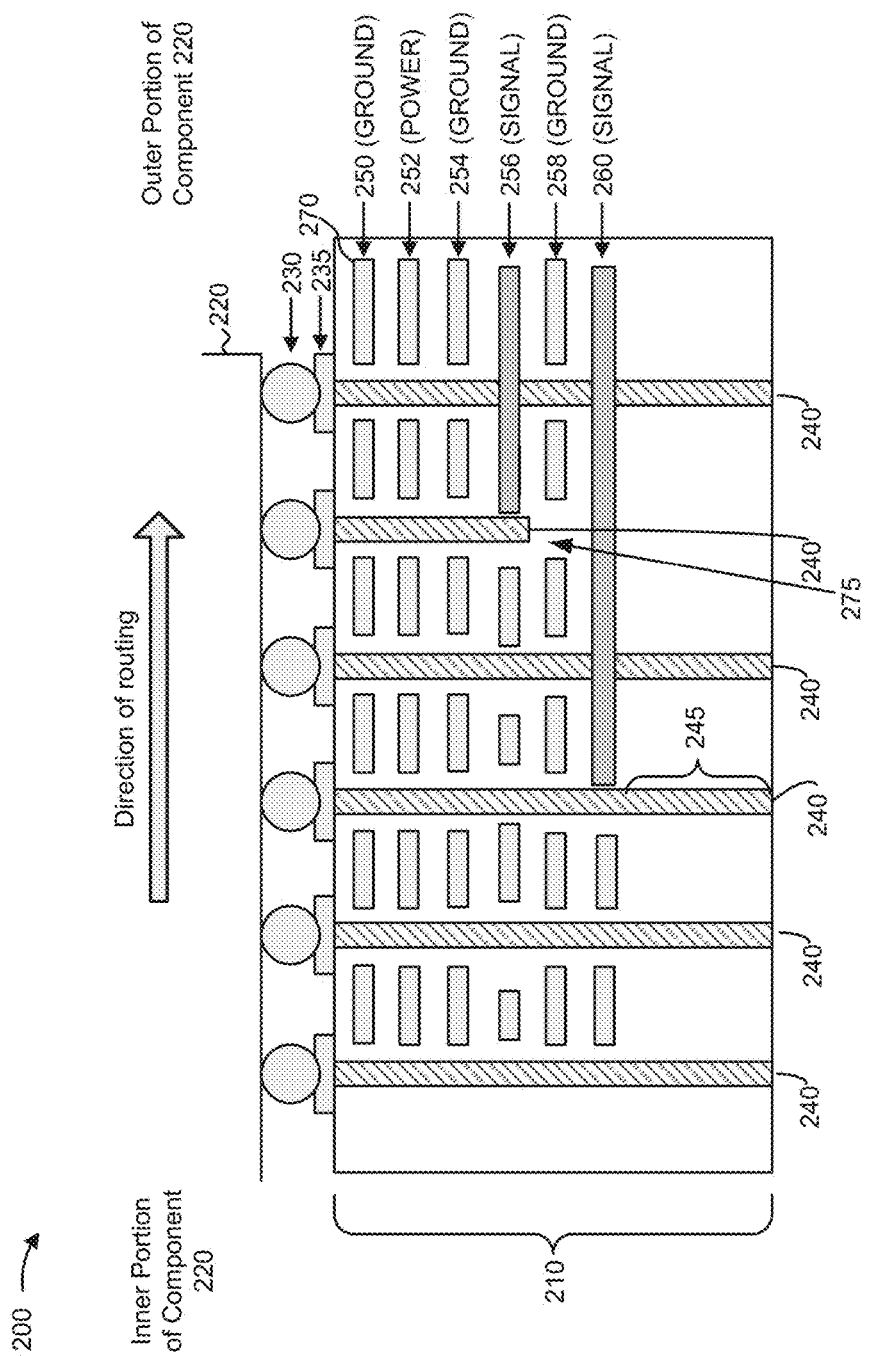
Figure 2C:
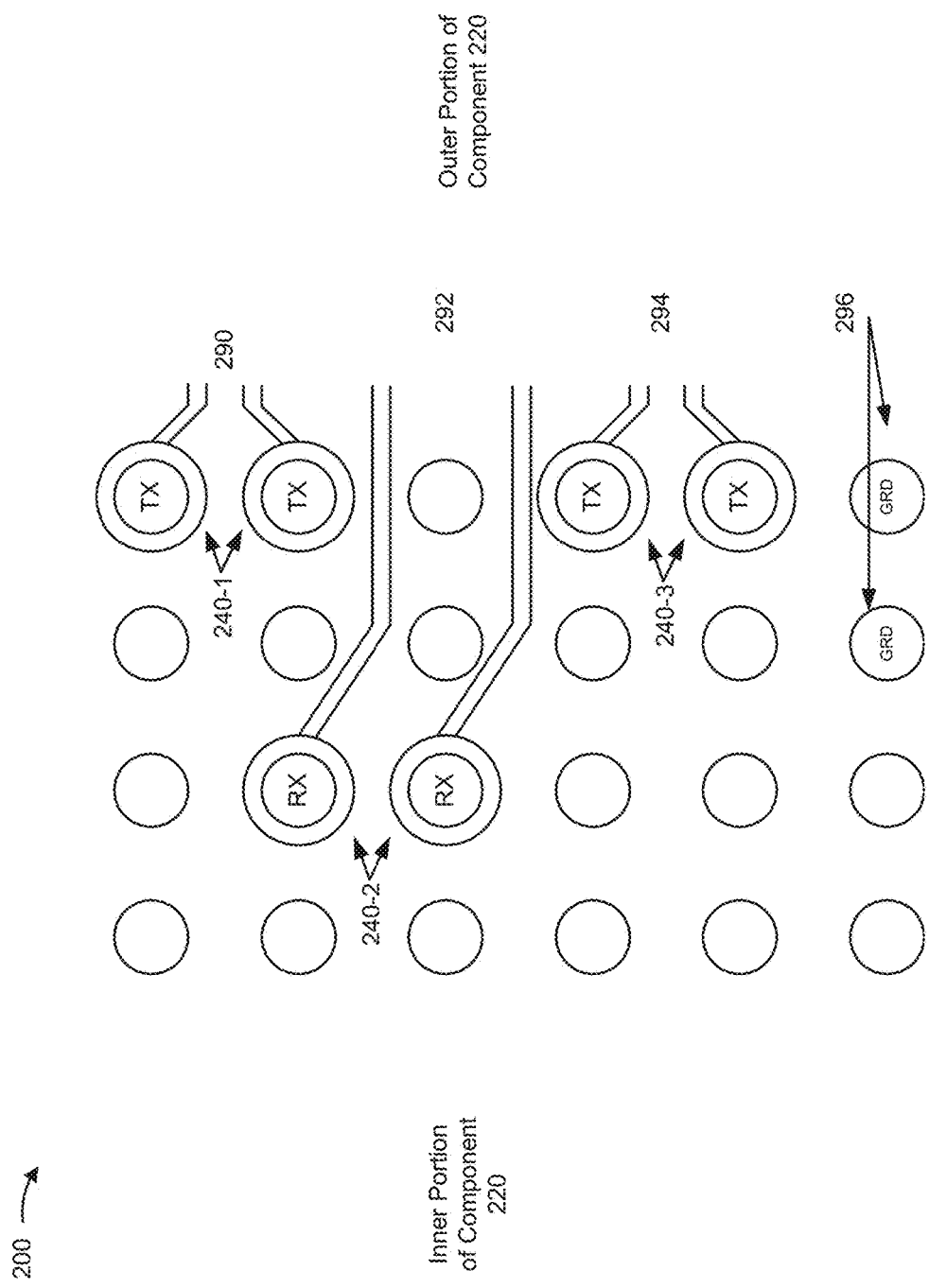

FIGS. 2A-2C are diagrams of an example implementation 200 of a printed circuit board assembly.

FIG. 2A is a diagram illustrating a partial cross-section view of a printed circuit board assembly. The cross-section view shown in FIG. 2A conceptually illustrates a layout of a PCB 210 as the layout of the PCB relates to the connection of and routing of signals for a component 220. As shown, component 220 is illustrated as connected to PCB 210 via a ball grid array 230. Ball grid array 230 may, for example, be soldered to pads 235 of PCB 210. Assume that routing is performed in the direction from the inner portion of component 220 to the outer portion of component 220.

PCB 210 is shown as including a number of vias 240. A via 240 may generally be a vertical electrical connection between different layers of PCB 210. Each via 240 may include, at each layer, a pad that provides electrical connections between copper races on the layer or an antipad that defines a non-conductive "void" around the via to insulate the via from that layer. A number of example layers 250, 252, 254, 256, 258, and 260 are shown in PCB 210. Each layer 250-260 may include conductive traces (e.g., copper traces) that route power, signal, and/or ground communication paths through PCB 210. Each layer 250-260 may be generally electrically isolated from one another, but may be potentially connected through vias 240.

In some designs, it may be desirable to dedicate certain ones of layers 250-260 as power layers or ground layers. For example, as shown in FIG. 2A, ground layers 250, 254, and 258 are alternated between power layer 252 and signals layers 256 and 260. Signal layer 256 may route a particular signal from ball grid array 230 toward component 220 and signal layer 260 may route another signal from ball grid array 230 toward component 220.

The portion of vias 240 that extend below the last layer to which the vias connect may create stubs. Stub 245 is particularly labeled in FIG. 2A. Stub 245 can create undesirable distortions in the signals that traverse the vias and/or signals being routed at a layer adjacent to the vias. The distortions may become more acute as the operating frequency increases. To decrease the deleterious effect of the stubs, the stubs may be backdrilled to physically remove the stub.

The rectangles shown in FIG. 2A, such as rectangle 270, for each of layers 250-260, may represent conductive traces for the layers. The breaks in the rectangles around vias 240 may define the antipads (i.e., non-conductive areas around a via 240). An antipad may function to isolate a via 240 from the PCB layer traversed by the via 240.

As shown by reference number 275, a first via 240 may be backdrilled to physically remove the stub. The first via 240 may extend from ball grid array 230 to layer 256. Assume that layer 256 corresponds to layer 5 of a stack-up (e.g., the S-1H layer, indicating the first (1) signal (S) routing layer of PCB 210 that is associated with horizontal (H) routing of signals in a Manhattan routing scheme and corresponding to the 1H layer in FIG. 1, first with respect to the PCB surface to which component 220 is mounted), described in detail with regard to FIG. 4. Layer 256 and the particular via 240 may be selected for TX routing in PCB 210 (e.g., a SerDes ASIC). A second via 240 (i.e., identified by reference number 275) may extend from ball grid array 230 to layer 260. Assume that layer 260 corresponds to layer 9 of the stack-up (e.g., the S-3H layer, indicating the third (3) signal (S) routing layer of PCB 210 that is associated with horizontal (H) routing of signals in a Manhattan routing scheme and corresponding to the 3H layer in FIG. 1), described in detail with regard to FIG. 4. Layer 260 and the second via 240 may be selected for RX routing in PCB 210. The first via 240 may be termed an outer via based on the first via 240 being located between the second via 240 and the outer portion of component 220 (e.g., a first edge of component 220). Similarly, the second via 240 may be termed an inner via based on the second via 240 being located between the first via 240 and the inner portion of component 220 (e.g., a portion between the first edge of component 220 and a second edge of component 220). Assume that routing of the TX signals and/or RX signals is directed toward the outer portion of component 220. In this case, RX signals being routed via layer 260 will experience reduced cross-talk, compared with other configurations, because conductive material of the first via 240 (e.g., the outer via) performing TX routing has been removed by backdrilling. Without the conductive material, line-to-via coupling is reduced. In another example, where the direction of routing is toward the inner portion of component 220, crosstalk may be reduced by the utilizing the inner via in association with layer 256 for routing a signal, utilizing the outer via in association with layer 260 for routing another signal, and backdrilling the inner via to a location between layer 260 and layer 256.

FIG. 2B is a diagram illustrating an example top view of ball grid array 230 of PCB 210. As shown in FIG. 2B, ball grid array region 230 may be surrounded by a set of outer edges 280-1 to 280-4 corresponding to the outer portion of component 220. Ball grid array 230 may surround a set of inner edges 282-1 to 282-4 corresponding to the inner portion of component 220. Via 284-1 may be termed an outer via 284-1 based on outer via 284-1 being located between outer edge 280-1 (e.g., a nearest outer edge) and inner via 286-1. Via 286-1 may be termed an inner via 286-1 based on inner via 286-1 being located between outer via 284-1 and inner edge 282-1 (e.g., a nearest inner edge). Similarly, via 284-2, via 284-3, and via 284-4 may be termed outer vias and via 286-2, via 286-3, and via 286-4 may be termed inner vias.

FIG. 2C is a diagram illustrating an example composite top view of routing layers of PCB 210. As shown in FIG. 2C, multiple vias 240 may be arranged as vertical electrical connections for ball grid array 230. As shown by reference number 290, TX routing may be performed at layer 256 by a first pair of signal paths connecting to a first pair of vias 240-1. As shown by reference number 292, RX routing may be performed at layer 260 by a second pair of signal paths connecting to a second pair of vias 240-2. As shown by reference number 294, TX routing may also be performed at layer 256 by a third pair of signal paths connecting to a third pair of vias 240-3. Routing is performed in a direction toward the outer portion of component 220. In another example, RX routing may also be performed (e.g., at layer 260) by a fourth pair of signal paths connecting to a fourth pair of vias 240. As shown by reference number 296, some vias 240 in ball grid array 230 may not be utilized for TX routing or RX routing and may be reserved as signal grounds. The TX and RX vias may be positioned as adjacent pairs (e.g., a first TX via paired with a second TX via and/or a first RX via paired with a second RX via), as shown in FIG. 2C. In another example, the TX and RX vias may be positioned as interleaved pairs (e.g., a first TX via paired with a first RX via and/or a second TX via paired with a second RX via).

FIGS. 2A-2C illustrate one example design for PCB 210 where the TX routing layer and RX routing layer are selected based on the direction of routing TX/RX signals and the position of the TX/RX vias, and backdrilling is performed for vias to reduce crosstalk. In some implementations, PCB 210 may include, for example, different quantities/sizes of vias, different quantities of signal paths, different quantities of layers, different quantities/arrangements of ball grid contacts, or the like.

Figure 3:
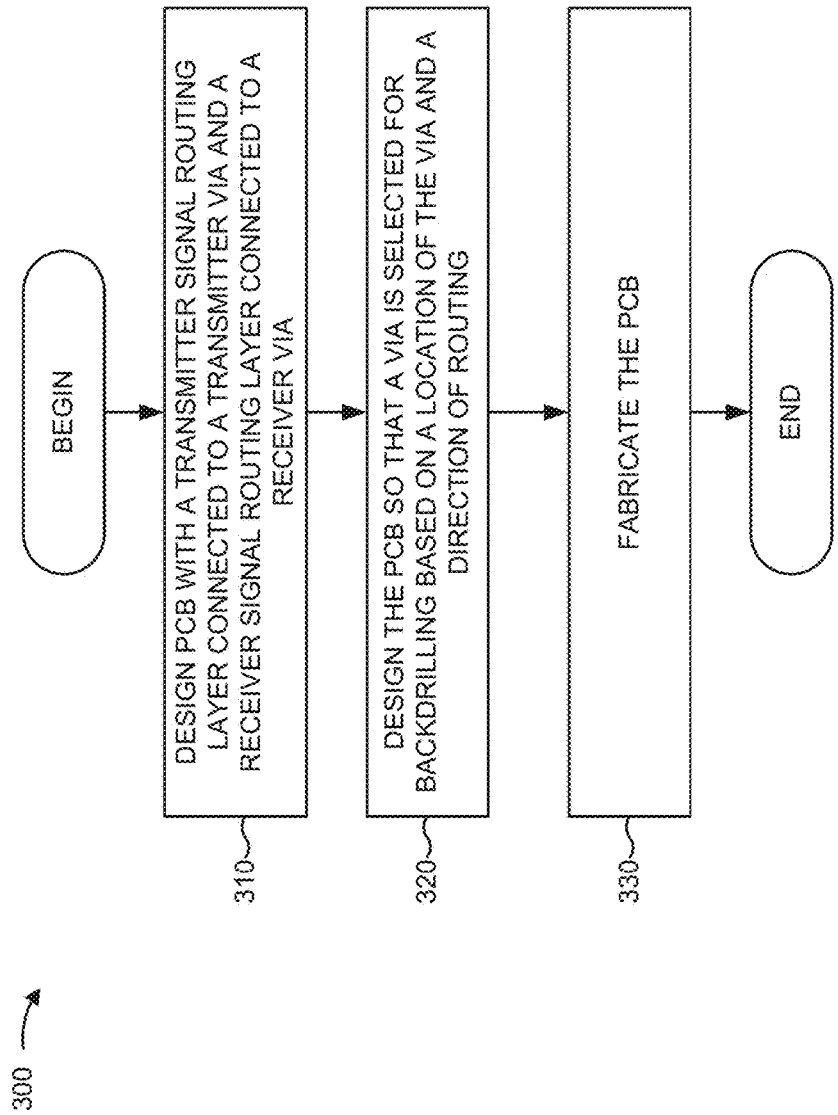
FIG. 3 is a flow chart of an example process for fabricating a printed circuit board with reduced cross-talk at the ball grid array region and the connector region.

FIG. 3 is a flow chart illustrating an example process 300 for fabricating a printed circuit board with reduced crosstalk at the ball grid array region and the connector region. Process 400 may be applied to the design of a PCB used to route a set of high speed serial signals, such as a PCB associated with a SerDes ASIC.

Process 300 may include designing a PCB with a transmitter signal routing layer connected to a transmitter via and a receiver signal routing layer connected to a receiver via (block 310). A stack-up for the PCB is a description of the set of layers for the PCB. For example, the PCB may be described by a stack-up that includes a set of properties for each layer, such as a dielectric property (e.g., a description of a substrate for the layer), a thickness property (e.g., a thickness of the layer and/or the substrate for the layer), a weight property (e.g., a weight of conductive material for the layer per unit area), a routing property (e.g., a type of the layer), or the like. The dielectric property may refer to whether the layer is a core layer or a prepreg layer. Core layers and prepreg layers are described in detail with regard to FIG. 4. In some implementations, the PCB may be designed with a transmitter signal routing layer located above the receiver signal routing layer (e.g., above referring to being closer to a surface of the PCB to which component 220 connects). For example, the PCB may be designed with the transmitter signal routing layer (e.g., a signal plane associated with TX routing) located at layer 5 and the receiver signal routing layer (e.g., another signal plane associated with RX routing) located at layer 9. In this case, layer 5 may be located above layer 9. Additionally, or alternatively, the PCB may be designed with the receiver signal routing layer located above the transmitter signal routing layer. Additionally, or alternatively, the PCB may be a generically designed PCB that includes a first via connected to a first signal plane and a second via connected to a second signal plane.

Process 300 may further include designing the PCB so that a via is selected for backdrilling based on a location of the via and a direction of routing (block 320). For example, assume that a first signal is routed at a first signal layer and by a first via and a second signal is routed at a second signal layer and by a second via and that signal routing is from the inner portion of component 220 (e.g., toward the portion of the PCB corresponding to the inner portion of component 220) toward the outer portion of component 220 (e.g., toward a portion of the PCB corresponding to an outer portion of component 220). In this case, an outer via may be selected for backdrilling. For example, if the first via is an outer via, than the first via is selected for backdrilling. Additionally, or alternatively, if the second via is the outer via, than the second via is selected for backdrilling.

Additionally, or alternatively, assume that a first signal is routed at a first signal layer and a second signal is routed at a second signal layer and that signal routing is from the outer portion of component 220 toward the inner portion of component 220. In this case, an inner via may be selected for backdrilling. For example, if the first via is an inner via, than the first via is selected for backdrilling. Additionally, or alternatively, if the second via is the inner via, than the second via is selected for backdrilling.

By selecting a via for backdrilling based on the location of the via and the direction of the routing (e.g., backdrilling the inner via when routing in the inner direction and backdrilling the outer via when routing in the outer direction) and by selecting signaling layers accordingly (e.g., the backdrilled via routes a first signal to an upper signal layer and the non-backdrilled via routes a second signal to a lower signal layer, upper and lower being comparative) cross-talk is reduced compared with designing the PCB without the via being backdrilled, with another via being backdrilled, with another routing configuration, or the like.

In some implementations, the PCB may be assembled after fabrication. For example, a component, such as a high speed serial link component (e.g., component 220), may be installed so that the component is electrically connected to the signal layers by the vias. Component 220 may have a first edge corresponding to an outer portion and a second edge corresponding to an inner portion. In some implementations, component 220 may have a first set of edges corresponding to the outer portion and a second set of edges corresponding to the inner portion. In some implementations, the PCB may be backdrilled based on assembling the PCB. For example, when signals are routed toward the inner direction of component 220, an inner via may be backdrilled to between the first signal layer (e.g., an upper layer to which the inner via connects) and the second signal layer (e.g., a lower layer to which an outer via connects). Additionally, or alternatively, when signals are routed toward the outer direction of component 220, the outer via may be backdrilled to between the first signal layer (e.g., an upper layer to which the outer via connects) and the second signal layer (e.g., a lower layer to which the inner via connects).

In this way, conductive material associated with the a first via does not extend to the a signal layer associated with routing signals from a second via, resulting in reduced cross-talk as compared with a PCB configuration in which the first via does extend to the signal layer.

As indicated above, FIG. 3 is provided merely as an example. Other examples are possible and may differ from what was described with regard to FIG. 3.

Figure 4:
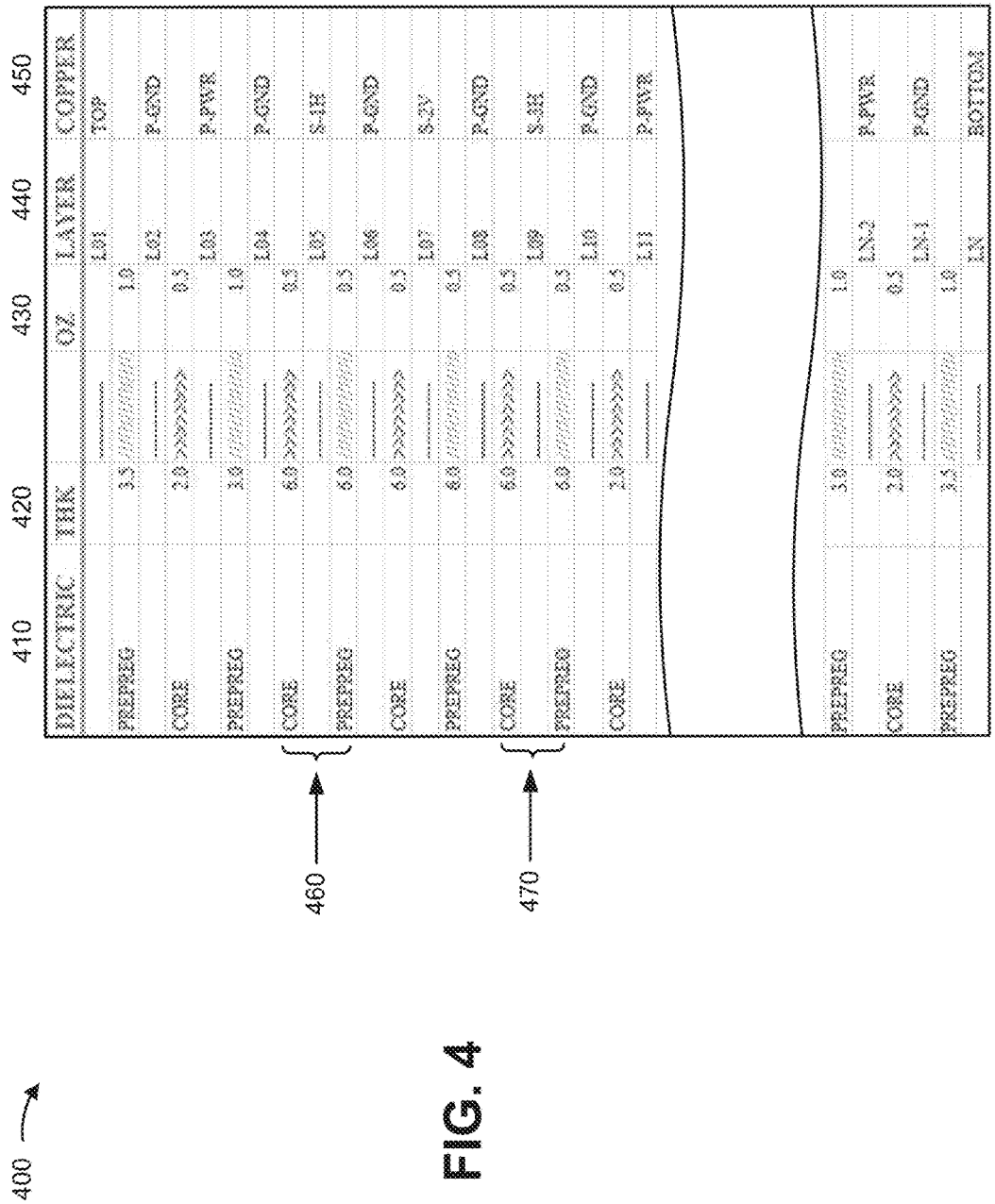
FIG. 4 is an example stack-up for a printed circuit board with reduced cross-talk at the ball grid array region and the connector region.

FIG. 4 is a diagram of an example stack-up 400 for a printed circuit board with reduced cross-talk at the ball grid array region and the connector region. Stack-up 400 may include a collection of fields associated with properties for a set of layers of a PCB 210, such as a dielectric property field 410, a thickness property field 420, a weight property field 430, a layer identifier field (440), and a routing property field (450).

Dielectric property field 410 may include information identifying a property of a substrate between a pair of layers of PCB 210. A core layer substrate may include a copper-plated glass-reinforced epoxy laminate sheet. Multiple core layers may be epoxied using a partially cured epoxy sheet, commonly called the prepreg layer. For example, dielectric property field 410 may indicate that a particular dielectric of PCB 210 is a core dielectric between copper layers of PCB 210 or a prepreg dielectric between copper layers of PCB 210.

Thickness property field 420 may include information identifying a thickness of a dielectric between a pair of copper layers of PCB 210. For example, a particular dielectric may be associated with a particular thickness.

Weight property field 430 may include information identifying a quantity of copper utilized for a layer of PCB 210 per unit area. For example, a first layer may include a first quantity of copper per unit area (e.g., measured in ounces (OZ) per square foot (sqft)) and a second layer may include a second quantity of copper per unit area.

Layer identifier field 440 may include information identifying layers of PCB 210. For example, a dielectric may be located between two layers that may be associated with a particular routing parameter. In this case, PCB 210 may include N layers. In other cases, PCB 210 may include fewer or additional layers Routing property field 450 may include information regarding a layer of PCB 210. For example, routing property field 450 may include information identifying a top layer (TOP) (e.g., a top layer of PCB 210 located at a top surface of PCB 210 and associated with copper foil on a substrate), a bottom layer (BOTTOM) (e.g., a bottom layer of PCB 210 located at a bottom surface of PCB 210 and associated with copper foil on a substrate), a ground plane layer (P-GND), a power plane layer (P-PWR), a signal layer (e.g., a horizontal routing signal layer, a vertical routing signal layer, etc.). In this example, PCB 210 may utilize a Manhattan routing scheme that include a set of horizontal routing signal layers (e.g., S-1H, S-3H, etc.) which route a first set of signal paths perpendicular to a second set of signal paths of a set of vertical routing layers (e.g., S-2V, indicating a second (2) signal (S) routing layer that is associated with vertical (V) routing of signals).

In some implementations, a particular layer of PCB 210 may be conceptually represented by a row of stack-up 400. As shown by reference number 460, layer 5 (LOS) may be designed as a horizontal signal routing layer (S-1H) that is above a prepreg layer of thickness 6.0 thousandths of an inch (mils) and copper weight of 0.5 ounces/square foot (oz/sqft) and below a core layer of thickness 6.0 mils and copper weight of 0.5 oz/sqft. Based on a via connecting layer 1 to layer 5 being backdrilled to between layer 5 and layer 9, layer 5 may be, for example, selected as a signal routing layer for TX routing. As shown by reference number 470, layer 9 (L09) may be designed as a horizontal signal routing layer (S-3H) that is above a prepreg layer of thickness 6.0 mils and copper weight of 0.5 oz/sqft and below a core layer of thickness 6.0 mils and copper weight of 0.5 oz/sqft. Based on a via connecting 1 to layer 5 being backdrilled to between layer 5 and layer 9 and another via connecting layer 1 to layer 9, layer 9 may be, in the example, selected as a signal routing layer for RX routing.

As indicated above, FIG. 4 is provided merely as an example. Other examples are possible and may differ from what was described with regard to FIG. 4.

Figure 5:
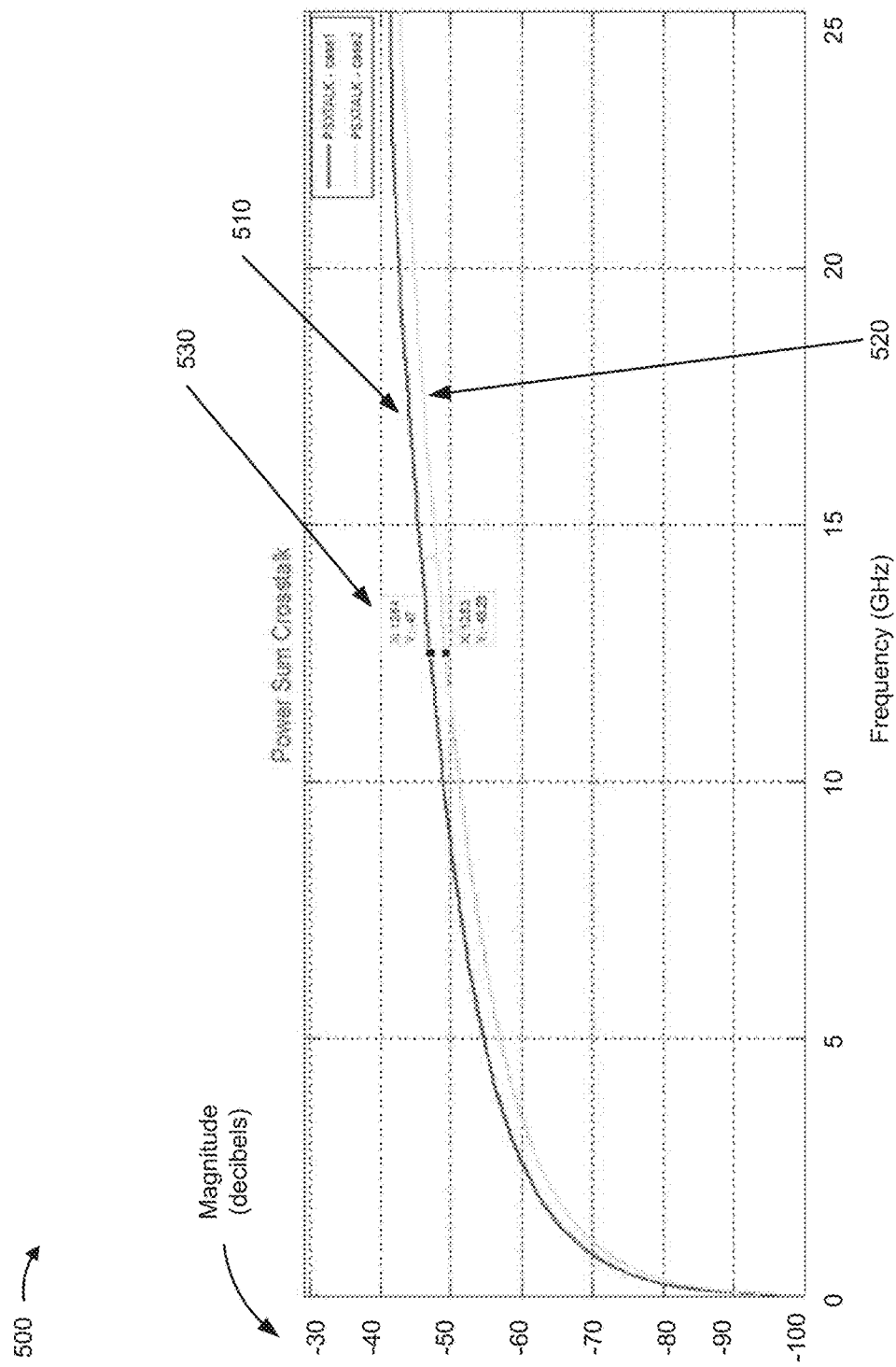
FIG. 5 is an example simulation of reduced cross-talk at the ball grid array region and the connector region.

FIG. 5 is a diagram of an example simulation 500 relating to reduced cross-talk at the ball grid array region and the connector region. As shown in FIG. 5, and by reference number 510, results are shown for an example simulation of a printed circuit board assembly 510 with RX routing performed at the 1H layer (e.g., layer 5), TX routing performed at the 3H layer (e.g., layer 9), and an RX via backdrilled to between the 1H layer and the 3H layer. As shown by reference number 520, results are shown for an example simulation of a printed circuit board assembly 520 described herein with TX routing at the HI layer (e.g., layer 5) and RX routing at the 3H layer (e.g., layer 9), and a TX via backdrilled to between the 1H layer and the 3H layer. Assume that for PCB 510 and PCB 520 signals are routed toward the outer edge of component 220, and that the TX via is an (outer via compared with the RX via). As shown by reference number 530, printed circuit board assembly 520 experiences a 2.23 decibel (db) reduction in cross-talk at 12.5 Gigahertz (GHz) compared with printed circuit board assembly 510.

As indicated above, FIG. 5 is provided merely as an example. Other examples are possible and may differ from what was described with regard to FIG. 5.

In this way, cross-talk may be reduced by configuring a PCB to route the first signals using a first PCB layer and second signals using a second PCB layer, with a first via associated with routing the first signals backdrilled based on the direction of signal routing and the comparative location of the first via and a second via associated with routing the second signals.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Even though particular combinations of features are recited in the claims and/or disclosed in the specification, these combinations are not intended to the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "group" and "set" are intended to include one or more items (e.g., related items, unrelated items, a combination of related items and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A multilayered printed circuit board (PCB) comprising:
    a plurality of pads associated with facilitating a connection to a component,
        the plurality of pads including a first pad and a second pad,
            the first pad being located between the second pad and a particular edge of the component;
    a plurality of horizontally disposed signal layers to route a set of signals toward the particular edge,
        one or more of the plurality of horizontally disposed signal layers comprising:
            a conductive trace, and
            an antipad that defines a non-conductive area; and
    a plurality of vertically disposed vias,
        a first via, of the plurality of vertically disposed vias, being:
            connected to the first pad, and
            selectively backdrilled between a first signal routing layer and a second signal routing layer, of the plurality of horizontally disposed signal layers, based on the set of signals being routed toward the particular edge, and
        a second via, of the plurality of vertically disposed vias, being connected to the second pad.

2. The multilayered PCB of claim 1, where one or more of the plurality of vertically disposed vias comprise an antipad that defines a non-conductive area.

3. The multilayered PCB of claim 1, where each of the plurality of horizontally disposed signal layers comprise one or more conductive traces for routing at least one of:
    power,
    a signal, or
    a ground communication path.

4. The multilayered PCB of claim 1, where the plurality of horizontally disposed signal layers comprise:
    at least one power layer, and
    at least one ground layer.

5. The multilayered PCB of claim 1, where one or more stubs of the plurality of vertically disposed vias are backdrilled.

6. The multilayered PCB of claim 1, where the non-conductive area insulates a via, of the plurality of vertically disposed vias, from the one or more of the plurality of horizontally disposed signal layers.

7. The multilayered PCB of claim 1, where the particular edge is associated with an outer portion of the component.

8. A device comprising:
    a plurality of pads associated with facilitating a connection between a printed circuit board (PCB) and a component,
        the component having a first edge and a second edge, and
        the plurality of pads including a first pad and a second pad,
            the first pad being located between the second pad and the first edge;
    a plurality of signal layers to route a set of signals toward the first edge,
        the plurality of signal layers being horizontal with respect to the PCB,
        the plurality of signal layers including a first signal routing layer and a second signal routing layer, and
        one or more of the plurality of signal layers comprising:
            a conductive trace; and
            an antipad that defines a non-conductive area; and a plurality of vias,
  a first via, of the plurality of vias, being:
    connected to the first pad, and
    selectively backdrilled between the first signal routing layer and the second signal routing layer based on the set of signals being routed toward the first edge, and
  a second via, of the plurality of vias, being connected to the second pad.

9. The device of claim 8, where the first signal routing layer is a transmitter layer and the second signal routing layer is a receiver layer.

10. The device of claim 8, where the PCB is connected to the component via a ball grid array.

11. The device of claim 8, where one or more stubs of the plurality of vias are backdrilled.

12. The device of claim 8, where the first edge is associated with an inner portion of the component.

13. The device of claim 8, where the plurality of signal layers comprise:
  at least one power layer, and
  at least one ground layer.

14. The device of claim 8, where each of the plurality of signal layers comprise:
  a conductive trace; and
  an antipad that defines a non-conductive area.

15. A method, comprising:
  fabricating, by a device, a printed circuit board (PCB) to include:
    a plurality of pads associated with facilitating a connection between the PCB and a component,
      the plurality of pads including a first pad and a second pad,
        the first pad being located between the second pad and a particular edge of the component,
    a first via connected to the first pad,
    a second via connected to the second pad, and
    a plurality of horizontally disposed signal layers to route a set of signals toward the particular edge,
      one or more of the plurality of horizontally disposed signal layers comprising:
        a conductive trace; and
        an antipad that defines a non-conductive area; and
  selectively backdrilling, by the device, the first via between a first signal routing layer and a second signal routing layer, of the plurality of horizontally disposed signal layers, based on the set of signals to be routed towards the particular edge,
    the second via not being backdrilled based on the first via being selectively backdrilled.

16. The method of claim 15, where fabricating the PCB includes:
  fabricating the PCB to include at least one of the plurality of horizontally disposed signal layers between the first signal routing layer and the second signal routing layer.

17. The method of claim 15, further comprising:
  backdrilling a stub of a third via connected to one of the plurality of pads.

18. The method of claim 15, where the PCB is connected to the component via a ball grid array.

19. The method of claim 15, where the first signal routing layer is a receiver layer and the second signal routing layer is a transmitter layer.

20. The method of claim 15, where each of the plurality of horizontally disposed signal layers comprise:
  a conductive trace; and
  an antipad that defines a non-conductive area.

* * * * *